(12) United States Patent
Alexander et al.

(10) Patent No.: US 6,329,590 B1
(45) Date of Patent: Dec. 11, 2001

(54) INTEGRATED METHOD FOR CONTAINMENT OF RADIATED ELECTROMAGNETIC RADIATION

(75) Inventors: Arthur Ray Alexander, Valley Center; James Leo Knighten, Poway, both of CA (US)

(73) Assignee: NCR Corporation, Dayton, OH (US)

( * ) Notice: Subject to any disclaimer, the term of this patent is extended or adjusted under 35 U.S.C. 154(b) by 0 days.

(21) Appl. No.: 09/452,923

(22) Filed: Dec. 2, 1999

(51) Int. Cl.[7] .................................................. H05K 9/20
(52) U.S. Cl. ................................................... 174/35 R
(58) Field of Search ............................ 174/32, 35 R, 174/35 MS, 35 GC

(56) References Cited

U.S. PATENT DOCUMENTS 4,247,737 * 1/1981 Johnson et al. .
5,519,168 * 5/1996 Owens .

\* cited by examiner

*Primary Examiner*—Edward H. Tso
(74) *Attorney, Agent, or Firm*—Gates & Cooper

(57) ABSTRACT

An apparatus and method for electromagnetic shielding is disclosed. The apparatus comprises an enclosure, a plate, and a material disposed between the enclosure and the plate. The enclosure has an aperture that is substantially transmissive to electromagnetic radiation. The plate is coupled to the enclosure proximate to the aperture, and covers the aperture completely with an area of overlap on all sides of the aperture. The material is disposed between the plate and the enclosure in the area of overlap between the plate and the enclosure and provides intimate contact between the enclosure and the plate to substantially prevent electromagnetic radiation from passing through the aperture when the plate is coupled to the enclosure.

18 Claims, 5 Drawing Sheets

US 6,329,590 B1

INTEGRATED METHOD FOR CONTAINMENT OF RADIATED ELECTROMAGNETIC RADIATION

BACKGROUND OF THE INVENTION

1 Field of the Invention

This invention relates in general to electronic components, and in particular to an integrated method for containment of radiated electromagnetic radiation.

2 Description of Related Art

As circuitry in electronics becomes more complex, packaging of the circuitry has become more difficult. The use of Printed Circuit Boards (PCBs) has made packaging of integrated circuits and other electronic components easier and efficient.

Clock speeds have also increased. This increase in speed has made it difficult to couple components together in such a way that the clock speeds are completely useable. Typically, the limitations of a system are contributed to, in part, by the packaging of the system itself.

Moreover, packaging often requires extensive electromagnetic analysis to determine if a component will adversely affect the environment in which the component will be operating. For example, some components are very sensitive to electromagnetic interference (EMI), and, as such, must be shielded. Components, because of dense packing and higher power outputs, generate EMI that must be shielded from other components that are in close physical proximity to the radiating component.

With the increasing clock and microprocessor operating frequencies present in modern electronics, the containment of electromagnetic (EM) emissions becomes more and more difficult, because more components are affected by EM emissions. As such, several products are available that attempt to address the problem of EM emissions. Typically, these products are designed to be added to removable elements and the access openings of electronic enclosures during the assembly process.

For example, fingerstock, typically made of beryllium copper, is added to doors and openings to attempt to create a Faraday cage around a component or enclosure. Other approaches use elastomers impregnated with conductive materials or fabrics that are impregnated with conductive material, to enhance the conductive bond between seams in an enclosure. However, use of these approaches adds to the labor content of the enclosure, increases the number of parts to manage, and can be inadvertently or deliberately removed, inadvertently or deliberately damaged, or omitted from the assembly through an assembly error, thereby disabling the EM containment.

It can be seen, then, that there is a need in the art for a method and apparatus that provides EM containment. Further, there is a need in the art for components that can provide the shielding without the possibility of inadvertent removal or assembly omission.

SUMMARY OF THE INVENTION

To overcome the limitations in the prior art described above, and to overcome other limitations that will become apparent upon reading and understanding the present specification, the present invention discloses an apparatus and method for electromagnetic shielding. The apparatus comprises an enclosure, a plate, and a material disposed between the enclosure and the plate. The enclosure has an aperture that is substantially transmissive to electromagnetic radiation. The plate is coupled to the enclosure proximate to the aperture, and covers the aperture completely with an area of overlap on all sides of the aperture. The material is disposed between the plate and the enclosure in the area of overlap between the plate and the enclosure and provides intimate contact between the enclosure and the plate to substantially prevent electromagnetic radiation from passing through the aperture when the plate is coupled to the enclosure.

An object of the present invention is to provide a method and apparatus that provides EM containment. A further object of the present invention is to provide components that can provide the necessary EM containment without the possibility of inadvertent removal or assembly omission.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to the accompanying detailed description, in which there is illustrated and described specific examples of a method and apparatus in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention discloses a scheme for containment of emissions that is integrated into the base part, rather than utilizing add-on components. For access openings in enclosures, e.g., panels, doors, or other apertures that use heavy gauge metals, this scheme can take the form of an interfacial seal that can be welded to one of the members. The present invention is cost effective, durable, and non-removable.

Detailed Description

Figure 1A:
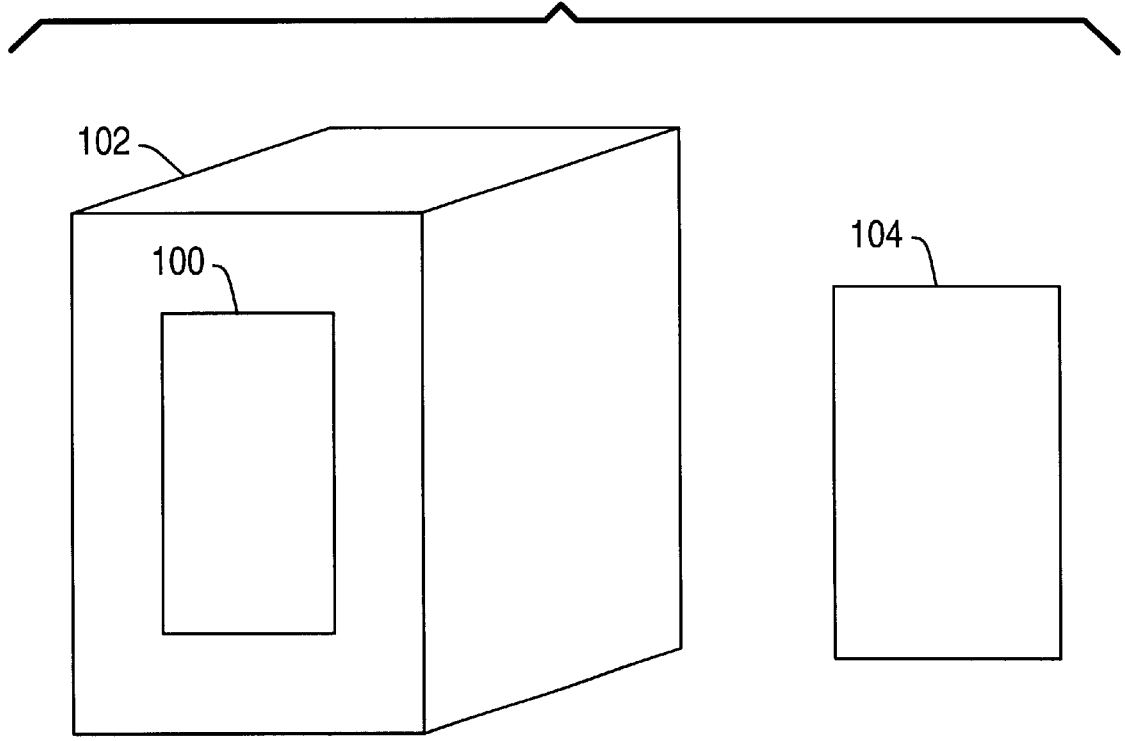
FIGS. 1A–1C illustrate a typical application of the component of the present invention.
Figure 1B:
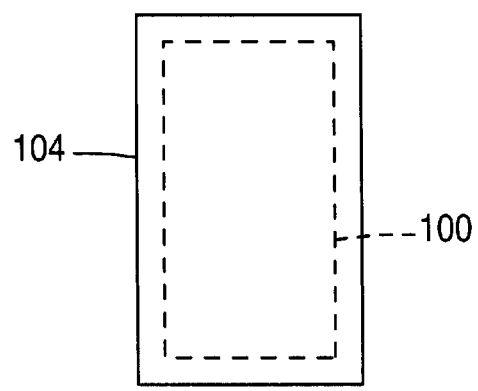
Figure 1C:
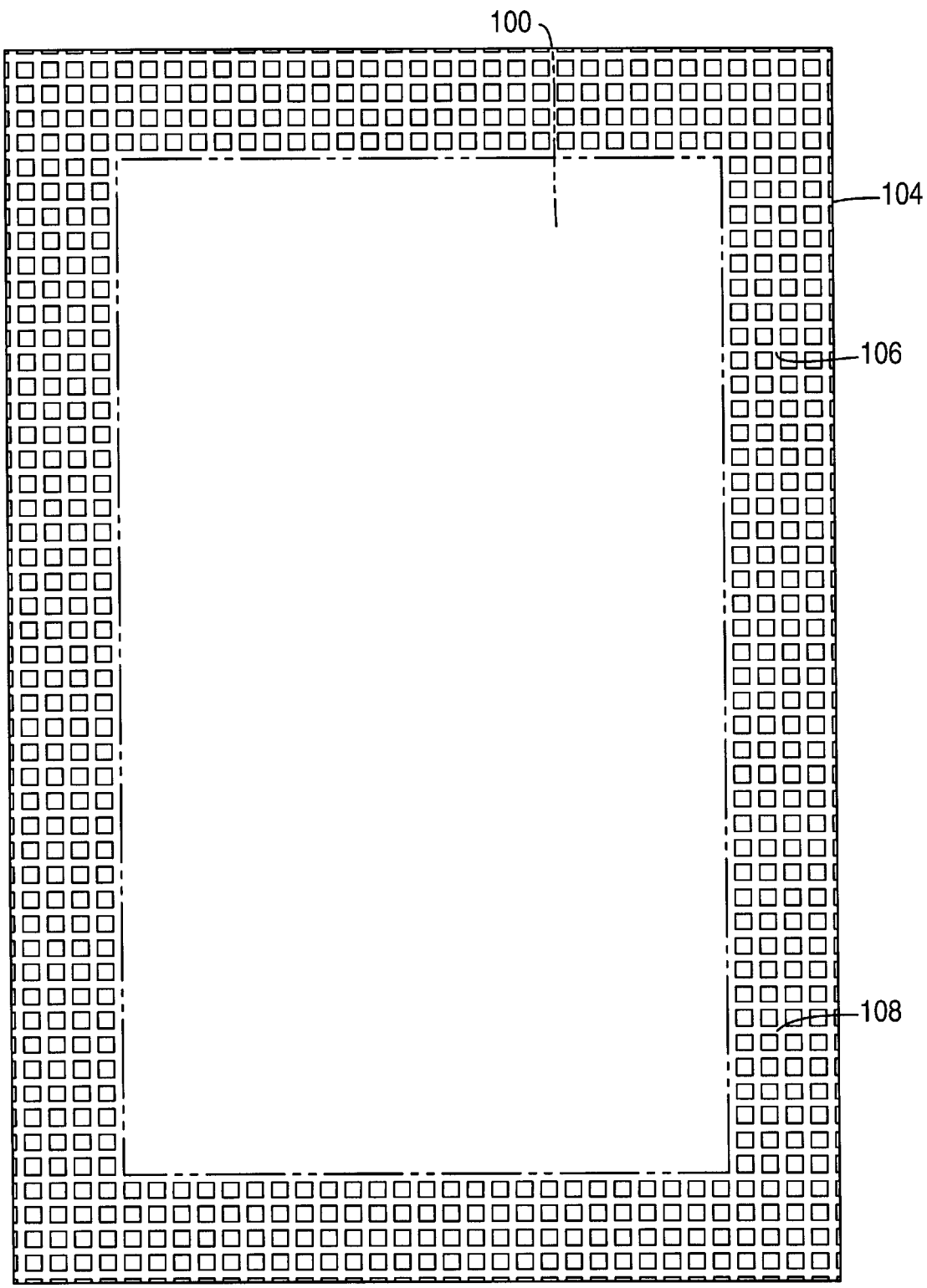

FIGS. 1A–1C illustrate an embodiment of the present invention. FIG. 1A illustrates an opening 100 in an enclosure 102, and a door or cover panel 104 that is designed to cover the opening 100. Opening 100 can be a physical aperture, or another opening 100 that is substantially transmissive to electromagnetic radiation. Door 104 and enclosure 102 are typically made of metal, which provides EM containment, but door 104 and enclosure 102 can be made of other materials that will provide EM containment or is otherwise substantially containing of electromagnetic radiation. The enclosure 102 can be an equipment rack, card cage, cabinet, or other electronic enclosure. Typically, door 104 is approximately the same size as opening 100, and usually a little smaller than opening 100, such that door 104 fits within opening 100. However, in an EM emission application, the spaces between the edge of door 104 and opening 100, when door 104 is smaller than opening 100, would allow EM emissions to "leak out" of opening 100 through the spaces between opening 100 and door 102. This leakage of EM emissions is unacceptable for EM sensitive components and environments.

The present invention provides for door 104 to be wider and longer than opening 100, as shown in FIG. 1B. This configuration substantially seals opening 100 from allowing EM emissions from within enclosure 102 from escaping. Conversely, the configuration also substantially seals opening 100 from allowing EM emissions from entering enclosure 102 through opening 100.

Although oversized door 104 substantially seals opening 100 from any EM flux, there will still be leakage through opening 100 because there is not a consistent and intimate metal-to-metal contact between door 104 and enclosure 100 (or opening 100). FIG. 1C illustrates that portion 106, which is the excess width and height of door 104, is either perforated or raised to force intimate and continuous contact between door 104 and enclosure 102 (or opening 100).

Portion 106 can either be raised, such as is performed by adding material 108 to door 104 throughout portion 106, to force a substantially continuous and tight seal between door 104 and enclosure 102. Further, portion 106 may contain raised perforations, such as a sharp finger to scratch or otherwise gouge into enclosure in the area near opening 100, or some other perforation such as a circular or other shaped opening in the portion 106 to force intimate contact between door 104 and enclosure 102. As door 104 is opened and closed, portion 106 makes physical and electrical contact with enclosure 102, which creates a Faraday wall where opening 100 exists.

Portion 106 can be made by rolling a metal stamping roller or other device over portion 106 to raise or otherwise interrupt the substantially smooth surface of door 104 to allow for intimate metal-to-metal contact between door 104 and enclosure 102. Further, portion 106 can be made on enclosure 102 in addition to or instead of door 104 if desired. By raising or otherwise providing portion 106 on door 104 and/or enclosure 102, the EM containment or shielding provided by door 104 and enclosure 102 cannot be defeated by assembly omission, incorrect installation, or other methods. Once door 104 is closed against enclosure 102, the raised portion 106 comprising perforations and/or raised structures, or created by adding material 108 to door 104 and/or enclosure 102, EM containment and/or shielding is assured without any additional assembly steps for enclosure 100.

The perforations or material 108 of portion 106 can resemble any structure that creates metal-to-metal contact between door 104 and enclosure 100, such as needle-like structures pointed at an angle to gouge enclosure 100, a "cheese grater" structure, typically a closely spaced series of ragged edge perforations, that grates or gouges enclosure 102 upon the closing of door 104, or other structures. Material 108 within portion 106 can also be raised metal strips that are placed under compression when door 104 is closed against enclosure 100, or created by an operation that raises the base material or disturbs or interrupts the surface of material 108. These surface interruptions created by the compression and/or gouging of the metal of enclosure 100 make intimate metal-to-metal contact between enclosure 102 and door 104. The portion 106 can be attached to the enclosure 102 or door 104. Material 108 can be mounted to either door 104 or enclosure 102, or both, as desired. The material 108 is durable in the sense that the door 104 may be removed many times without degrading the performance of the material 104.

Figure 2:
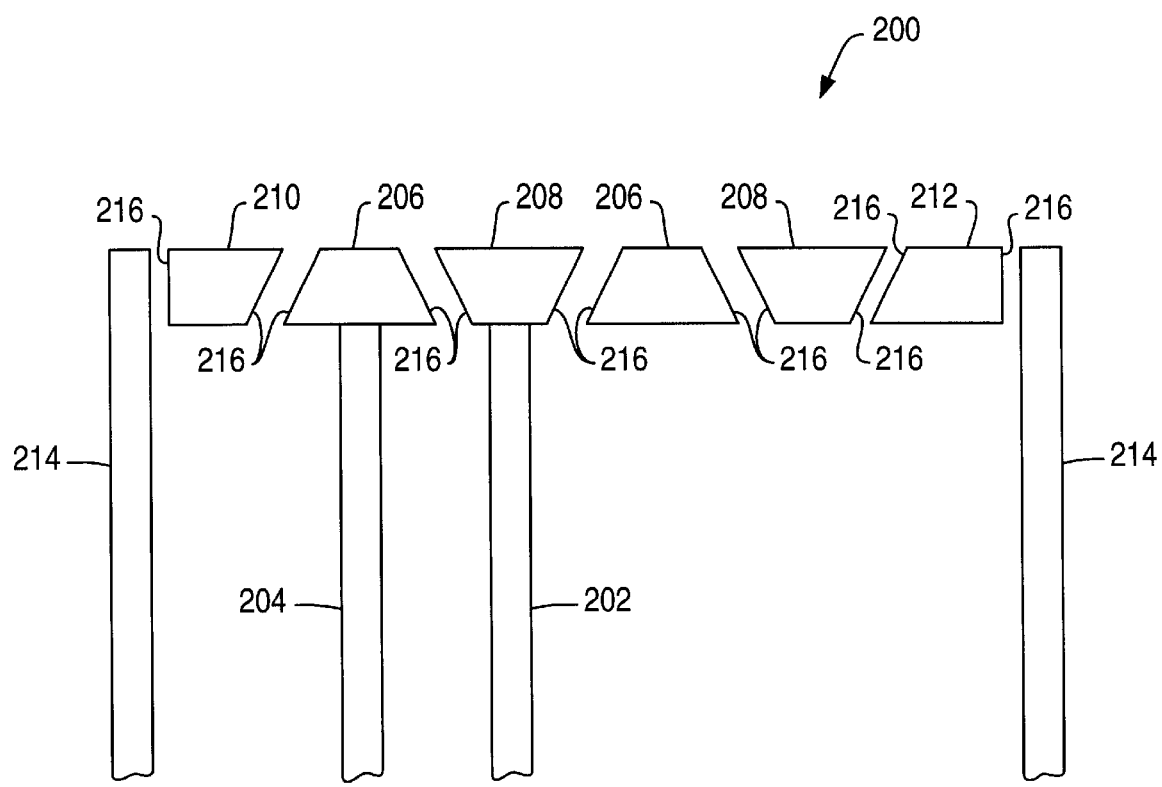
FIGS. 2 and 3A–3B illustrate preferred configurations of the present invention.

FIG. 2 illustrates an embodiment of the present invention used when several elements are closely spaced within an enclosure.

System 200 comprises elements 202 and 204, which are typically adjacent elements in an enclosure. Elements 202 and 204 can be printed circuit boards, "bricks" of an assembly, or other electronic devices. Elements 202 and 204 require shielding containment, either alone or in combination. Elements 202 and 204 can also require shielding from electromagnetic radiation emanated from the external electromagnetic environment.

Edge plates 206 mate with edge plates 208, as well as mating with edge plates 210 and 212, which then mate to side walls 214. Edge plates 206, 208, 210, and 212 comprise surfaces 216 that have material similar to material 108, which provides an intimate, metal-to-metal contact between edge plates 206–212 and side walls 214. This intimate metal-to-metal contact creates a Faraday cage which isolates elements 202 and 204 from the area outside of system 200. Edge plates 206 and 208 have staggered surfaces 216 that have a wider surface on one edge and a narrower surface on the opposing edge to allow for close spacing of elements 202 and 204. Further, this staggered, adjacent approach reduces the number of elements that must be removed to service a particular element 202 or 204.

Figure 3A:
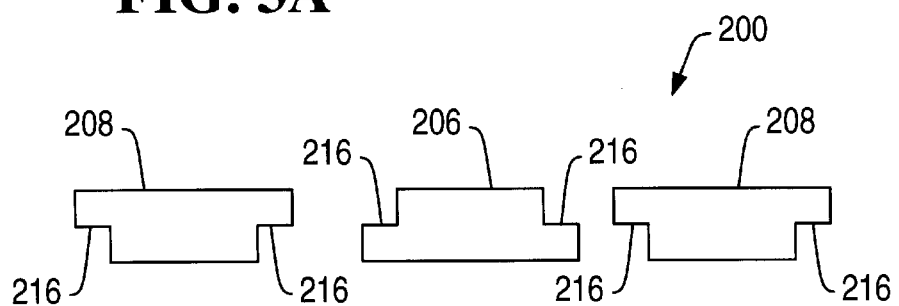
Figure 3B:
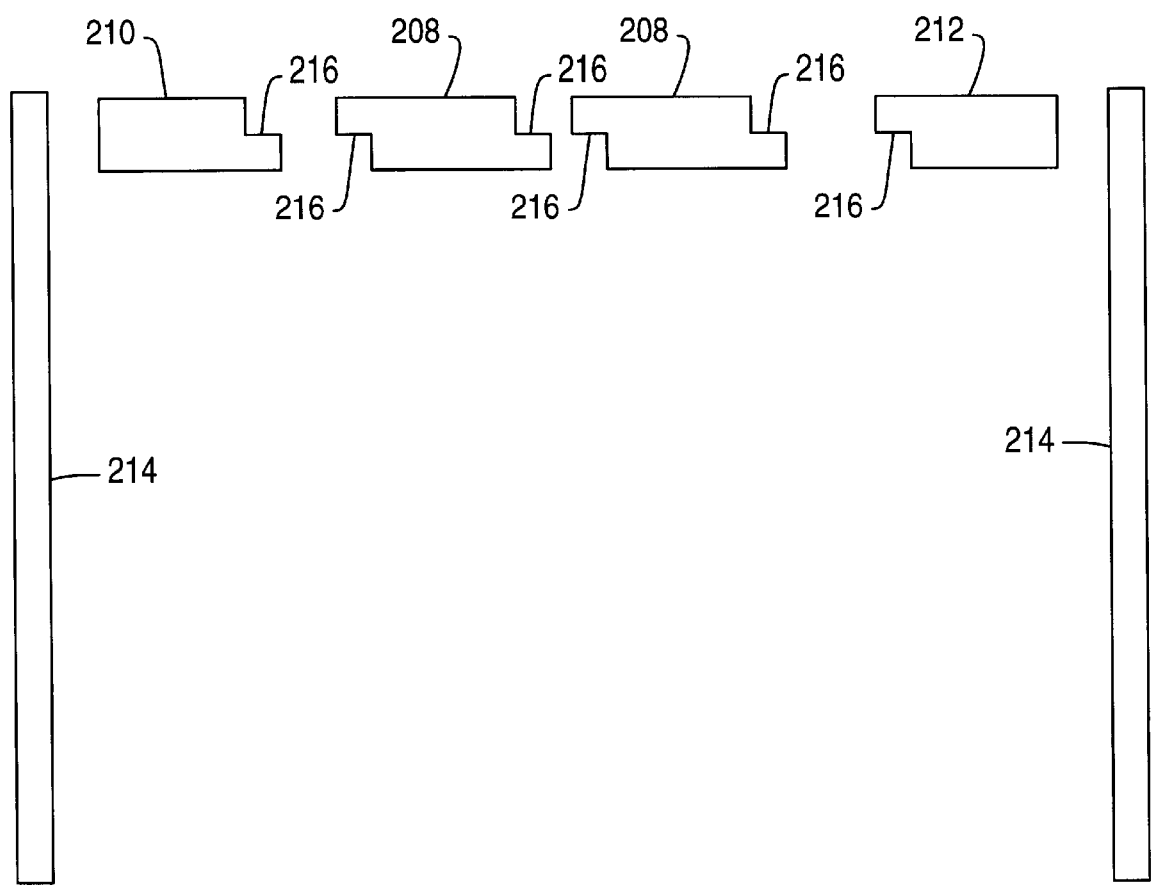

Although shown as diagonal, surfaces 216 can be stepped or interlocking where surfaces 216 are between edge plates 206 and 208, as shown in FIGS. 3A–3B. The interlocking shapes of FIG. 3A and the "Z" shapes of FIG. 3B allow for a single edge plate 208 to be removed from the assembly without removing adjacent plates 206. Further, an edge plate 206 can be removed by removing only one additional adjacent edge plate 208. Edge plates 210 and 212 provide for surfaces that will mate easily with side walls 214, and allow for partial population of system 200 with components 202 and 204.

The combination of edge plates 206 and 208 with side walls 214 provide a Faraday cage around components 202 and 204. As such, any electromagnetic radiation created within the Faraday cage will not be allowed to leave, and any electromagnetic radiation created outside of the Faraday cage will not be allowed to enter.

Figure 4:
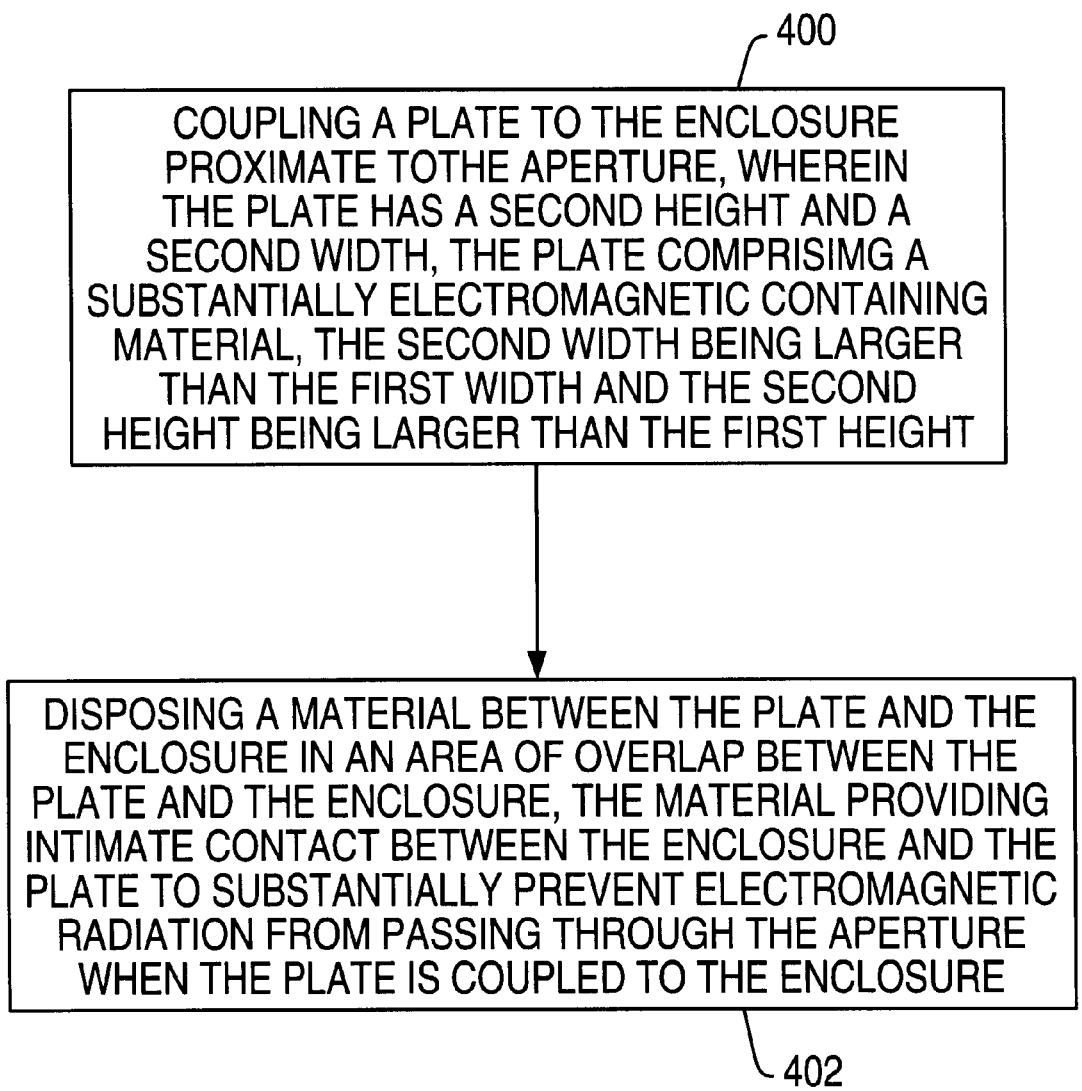
FIG. 4 is a flow chart illustrating the steps used to practice the present invention.

FIG. 4 is a flow chart illustrating the steps used to practice the present invention.

Block 400 illustrates performing the step of coupling a plate to the enclosure proximate to the aperture, wherein the plate has a second height and a second width, the plate comprising a substantially electromagnetic containing material, the second width being larger than the first width and the second height being larger than the first height.

Block 402 illustrates performing the step of disposing a material between the plate and the enclosure in an area of overlap between the plate and the enclosure, the material providing intimate contact between the enclosure and the plate to substantially prevent electromagnetic radiation from passing through the aperture when the plate is coupled to the enclosure.

Conclusion

In summary, the present invention discloses an apparatus and method for electromagnetic shielding. The apparatus comprises an enclosure, a plate, and a material disposed between the enclosure and the plate. The enclosure has an aperture that is substantially transmissive to electromagnetic radiation. The plate is coupled to the enclosure proximate to the aperture, and covers the aperture completely with an area of overlap on all sides of the aperture. The material is disposed between the plate and the enclosure in the area of overlap between the plate and the enclosure and provides intimate contact between the enclosure and the plate to substantially prevent electromagnetic radiation from passing through the aperture when the plate is coupled to the enclosure.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An electromagnetic shielding enclosure, comprising:
   an enclosure having an aperture that is substantially transmissive to electromagnetic radiation, the aperture having a first width and a first height;
   a plate coupled to the enclosure proximate to the aperture, the plate comprising a substantially electromagnetic containing material, the plate having a second width and a second height, the second width being larger than the first width and the second height being larger than the second height; and
   a material, disposable between the plate and the enclosure in an area of overlap between the plate and the enclosure, the material providing intimate contact between the enclosure and the plate to substantially prevent electromagnetic radiation from passing through the aperture when the plate is coupled to the enclosure.

2. The enclosure of claim 1, wherein the material is an additional thickness of metal.

3. The enclosure of claim 1, wherein the material is a perforated material.

4. The enclosure of claim 1, wherein the material is attached to the plate.

5. The enclosure of claim 1, wherein the material is attached to the enclosure.

6. The enclosure of claim 1, wherein the enclosure provides shielding to a component inside of the enclosure.

7. The enclosure of claim 1, wherein the enclosure contains electromagnetic radiation emanated from a component inside of the enclosure.

8. The enclosure of claim 1, wherein the plate comprises at least a first subplate and a second subplate; and a material disposable between the first subplate and the second subplate.

9. A method for providing electromagnetic shielding by an enclosure having an aperture having a first height and a first width, the aperture being substantially transmissive to electromagnetic radiation, comprising the steps of:
   coupling a plate to the enclosure proximate to the aperture, wherein the plate has a second height and a second width, the plate comprising a substantially electromagnetic containing material, the second width being larger than the first width and the second height being larger than the first height; and
   disposing a material between the plate and the enclosure in an area of overlap between the plate and the enclosure, the material providing intimate contact between the enclosure and the plate to substantially prevent electromagnetic radiation from passing through the aperture when the plate is coupled to the enclosure.

10. The method of claim 9, wherein the material is an additional thickness of metal.

11. The method of claim 9, wherein the material is a perforated material.

12. The method of claim 9, wherein the material is created by disturbing the surface of the base material.

13. The method of claim 9, wherein the material is attached to the plate.

14. The method of claim 9, wherein the material is attached to the enclosure.

15. An apparatus for containing electromagnetic radiation, comprising:
   an enclosure having an aperture that is substantially transmissive to electromagnetic radiation;
   a first edge plate having a first mating surface, the first edge plate comprising material that substantially contains electromagnetic radiation;
   a second edge plate having a second mating surface, the first and second edge plates being mounted to the enclosure to cover the aperture; and
   a material, disposable between the first mating surface of the first edge plate and the second mating surface of the second edge plate, the material providing intimate contact between the first edge plate and the second edge plate to substantially prevent electromagnetic radiation from passing through the aperture when the first edge plate and the second edge plate are mounted to the enclosure.

16. The apparatus of claim 15, wherein the first mating surface and the second mating surface are overlapping.

17. The apparatus of claim 15, further comprising a third edge plate and a fourth edge plate, wherein the third edge plate and fourth edge plate have mating surfaces that are designed to mate directly to the enclosure.

18. The apparatus of claim 15, wherein the first mating surface and the second mating surface are interlocking.

* * * * *